United States Patent [19]
Arase

[11] Patent Number: 5,745,402
[45] Date of Patent: Apr. 28, 1998

[54] FERROELECTRIC NON-VOLATILE MEMORY

[75] Inventor: Kenshiro Arase, Kanagawa, Japan

[73] Assignee: Sony Corporation, Japan

[21] Appl. No.: 755,403

[22] Filed: Nov. 22, 1996

[30] Foreign Application Priority Data

Nov. 24, 1995 [JP] Japan ................................. 7-306217

[51] Int. Cl.$^6$ ................................................. G11C 11/22
[52] U.S. Cl. ................................. 365/145; 365/189.01
[58] Field of Search ............................ 365/145, 189.01

[56] References Cited

U.S. PATENT DOCUMENTS 5,640,030  6/1997  Kenney ................................. 365/145

*Primary Examiner*—Terrell W. Fears
*Attorney, Agent, or Firm*—Ronald P. Kananen

[57] ABSTRACT

A ferroelectric non-volatile memory which can ensure a sufficient operational margin, wherein memory cells each constituted by a capacitor using a ferroelectric material for the dielectric film and a select transistor are arranged in a matrix to constitute a so-called folded bit-line structure, when reading out data to either a bit line of an even column or a bit line of an odd column, the other bit line is biased to a constant voltage, and, due to this, the coupling noise from adjoining bit lines is shielded.

5 Claims, 10 Drawing Sheets

FIG. 4

| READ CELL | M | M' |
|---|---|---|
| BIT LINE — BL | READ | SHIELD |
| BIT LINE — BL' | SHIELD | READ |
| SENSE AMPLIFIER — SA | ACTIVE | NON-ACTIVE |
| SENSE AMPLIFIER — SA' | NON-ACTIVE | ACTIVE |

FIG. 8

| READ CELL | | Ma | Ma' | Mb | Mb' |
|---|---|---|---|---|---|
| BIT LINE | BLa | READ Ma | SHIELD | READ RMa | SHIELD |
| | BLa' | SHIELD | READ Ma' | SHIELD | READ RMa' |
| | BLb | READ RMb | SHIELD | READ Mb | SHIELD |
| | BLb' | SHIELD | READ RMb' | SHIELD | READ Mb' |
| SENSE AMPLIFIER | SA | ACTIVE | NON-ACTIVE | ACTIVE | NON-ACTIVE |
| | SA' | NON-ACTIVE | ACTIVE | NON-ACTIVE | ACTIVE |

FERROELECTRIC NON-VOLATILE MEMORY

BACKGROUND OF THE INVENTION

1. Field of the Invention

The present invention relates to a ferroelectric non-volatile memory with a memory cell constituted by a transistor and a ferroelectric capacitor, more particularly relates to achievement of stability in a data read operation of a ferroelectric memory having a one-transistor, one-capacitor (1TR-1CAP) type cell.

2. Description of the Related Art

Known In the art is a ferroelectric nonvolatile memory using an oxide ferroelectric material having a perovskite structure (for example, $PbZrTiO_3$) or a Bismuth family layer perovskite structure as a dielectric film and storing data by utilizing the direction of polarization of the ferroelectric capacitor.

Also known is a method of a construction of a 1TR-1CAP type memory cell from a select transistor and a ferroelectric capacitor for a non-volatile memory.

In a ferroelectric non-volatile memory having the above-mentioned 1TR-1CAP type cell, however, the bit lines are influenced by the coupling noise between adjoining bit lines at the time of a data read operation, so the operational margin of the read operation decreases and therefore it is difficult to ensure a sufficient operational margin. Also, the coupling ratio between the capacitance between the bit lines and the capacitance of a bit line has been increasing along with the increasing miniaturization of memory cells, so it is anticipated that the effect of the coupling noise will become increasingly serious in the future.

SUMMARY OF THE INVENTION

An object of the present invention is to provide a ferroelectric non-volatile memory having a 1TR-1CAP type cell which is not influenced by coupling noise between bit lines at the time of a data read operation and which can ensure a sufficient operational margin at the time of a read operation and thereby achieve stable operation.

According to a first aspect of the present invention, there is provided a ferroelectric non-volatile memory comprising at least one first bit line and at least one second bit line arranged adjoining each other in a column direction and together constituting a folded bit-line structure, a first word line and a second word line arranged in a row direction orthogonal to the folded direction, a first memory cell constituted by a ferroelectric capacitor and a select transistor, one terminal of the select transistor being connected to the first bit line, another terminal of the select transistor being connected to one electrode of the ferroelectric capacitor, and a gate of the select transistor being connected to the first word line, a second memory cell constituted by a ferroelectric capacitor and a select transistor, one terminal of the select transistor being connected to the second bit line, another terminal of the select transistor being connected to one electrode of the ferroelectric capacitor, and a gate of the select transistor being. connected to the second word line, a first sense amplifier provided corresponding to the first bit line, and a second sense amplifier provided corresponding to the second bit line, wherein, when selecting the first memory cell and reading out its data, the data of the first memory cell is read out to the first bit line with the second bit line being set to a constant shield voltage, a potential of the first bit line and a reference voltage for comparison are compared in the first sense amplifier, and the data is judged by the result of the comparison, and, when selecting the second memory cell and reading out its data, the data of the second memory cell is read out to the second bit line with the first bit line being set to a constant shield voltage, a potential of the second bit line and a reference voltage for comparison are compared in the second amplifier, and the data is judged by the result of the comparison.

Preferably, when selecting the first memory cell and reading out its data, the second sense amplifier is deactivated, and when selecting the second memory cell and reading out its data, the first sense amplifier is deactivated.

According to a second aspect of the present invention there is provided a ferroelectric non-volatile memory, comprising a first memory array constituted by at least one 1a-th bit line and at least one 2a-th bit line arranged adjoining each other in a column direction and together constituting a folded bit-line structure, a 1a-th word line and a 2a-th word line arranged in a row direction orthogonal to the folded direction, a 1a-th memory cell constituted by a ferroelectric capacitor and a select transistor, one terminal of the select transistor being connected to the 1a-th bit line, another terminal of the select transistor being connected to one electrode of the ferroelectric capacitor, and a gate of the select transistor being connected to the 1a-th word line, a 2a-th memory cell constituted by a ferroelectric capacitor and a select transistor, one terminal of the select transistor being connected to the 2a-th bit line, another terminal of the select transistor being connected to an electrode of the ferroelectric capacitor, and a gate of the select transistor being connected to the 2a-th word line, a 1a-th reference cell provided corresponding to the 1a-th bit line, and a 2a-th reference cell provided corresponding to the 2a-th bit line; a second memory array constituted by at least one 1b-th bit line and at least one 2b-th bit line arranged adjoining each other in a column direction and together constituting a folded bit-line structure, a 1b-th word line and a 2b-th word line arranged in a row direction against the folded direction, a 1b-th memory cell constituted by a ferroelectric capacitor and a select transistor, one terminal of the select transistor being connected to the 1b-th bit line, another terminal of the select transistor being connected to one electrode of the ferroelectric capacitor, and a gate of the select transistor being connected to the 1b-th word line, a 2b-th memory cell constituted by a ferroelectric capacitor and a select transistor, one terminal of the select transistor being connected to the 2b-th bit line, another terminal of the select transistor connected to an electrode of the ferroelectric capacitor, and a gate of the select transistor being connected to the 2b-th word line, a 1b-th reference cell provided corresponding to the 1bth bit line, and a 2b-th reference cell provided corresponding to the 2b-th bit line; a first sense amplifier comparing a potential of the 1a-th bit line with a potential of the 1b-th bit line and reading out the data; and a second sense amplifier comparing a potential of the 2a-th bit line with a potential of the 2b-th bit line and reading out the data.

Preferably, when selecting the 1a-th memory cell and reading out its data, the data of the 1a-th memory cell is read out to the 1a-th bit line with the 2a-th and 2b-th bit lines being set to a constant shield voltage, a potential of the 1a-th bit line and a potential of the 1b-th bit line are compared in the first sense amplifier, and the data is judged by the result of the comparison, when selecting the 2a-th memory cell and reading out its data, the data of the 2a-th memory cell is read out to the 2a-th bit line and the data of the 2b-th reference cell is read out to the 2b-th bit line with the 1a-th and 1b-th bit lines being set to a constant shield voltage, a potential of the 2a-th bit line and a potential of the 2b-th bit line are compared in the second sense amplifier, and the data is judged by the result of the comparison, when selecting the 1b-th memory cell and reading out its data, the data of the 1b-th memory cell is read out to the 1b-th bit line and the data of the 1a-th reference cell is read out to the 1a-th bit line with the 2a-th and 2b-th bit lines being set to a constant shield voltage, a potential of the 1a-th bit line and a potential of the 1b-th bit line are compared in the first sense amplifier, and the data is judged by the result of the comparison, and when selecting the 2b-th memory cell and reading out its data, the data of the 2b-th memory cell is read out to the 2b-th bit line and the data of the 2a-th reference cell is read out to the 2a-th bit line with the 1a-th and 1b-th bit lines being set to a constant shield voltage, a potential of the 2a-th bit line and a potential of the 2b-th bit line are compared in the second sense amplifier, and the data is judged by the result of the comparison.

Further, preferably, when selecting the 1a-th or 1b-th memory cells and reading out its data, the second sense amplifier is deactivated, and when selecting the 2a-th or 2b-th memory cell and reading out its data, the first sense amplifier is deactivated.

According to the first aspect of the ferroelectric non-volatile memory, there is provided a memory array of 1TR-1CAP type memory cells and a folded bit-line structure wherein the bit lines are each arranged adjoining folded bit lines arranged so that they alternate with them. Further, when reading out the data of a memory cell, the bit line in the folded direction of the read bit line is set to a constant shield voltage. Therefore, it is possible to completely prevent coupling noise between bit lines.

Also, since one of the pair of sense amplifiers provided corresponding to the folded bit-line structure is deactivated in accordance with the selection of a memory cell, it is possible to reduce the power consumption at the time of operation.

According to the second aspect of the ferroelectric non-volatile memory, there is provided a first memory array and second memory array of 1TR-1CAP type memory cells and folded bit-line structures wherein the bit lines are each arranged adjoining folded bit lines arranged so that they alternate with them. Further, when reading out the data of a memory cell, the bit line in the folded direction of the read bit line of the selected memory array and the bit line in the folded direction of the reference bit line of the non-selected memory array are set to a constant shield voltage. Therefore, it is possible to completely prevent coupling noise between the bit lines.

Also, since one of the pair of sense amplifiers provided corresponding to the folded bit line structure of the selected memory array is deactivated in accordance with the selection of a memory cell, it is possible to reduce the power consumption at the time of operation.

BRIEF DESCRIPTION OF THE DRAWINGS

These and other objects and features of the present invention will become more apparent from the following description of the preferred embodiments made with reference to the drawings, in which:

FIG. 4 is a view showing how the bit lines are set and which sense amplifiers are selected at the time of a read operation in the memory array shown in FIG. 3;

FIG. 8 is a view of how the bit lines are set and which sense amplifiers are selected at the time of a read operation in the memory array shown in FIG. 7;

DESCRIPTION OF THE PREFERRED EMBODIMENTS

Preferred embodiments of the present invention will now be explained in further detail with reference to the drawings.

First, an explanation will be made of the hysteresis of a ferroelectric capacitor with reference to FIGS. 1A to 1C.

Figure 1A:
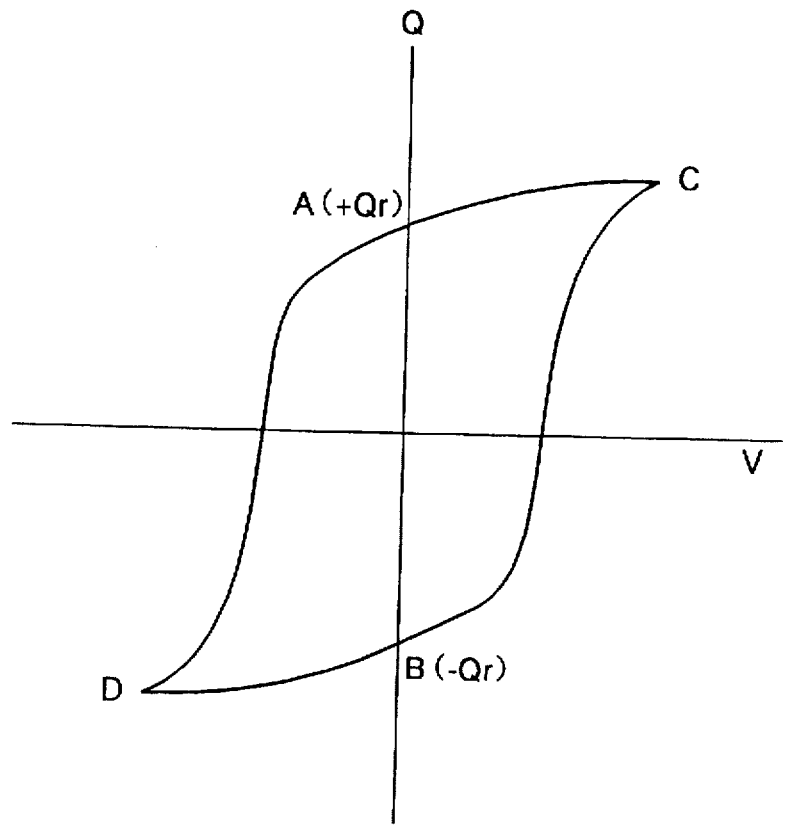
FIG. 1A is a view of the hysteresis of a residual charge in dielectric polarization of a ferroelectric capacitor.
Figure 1B:
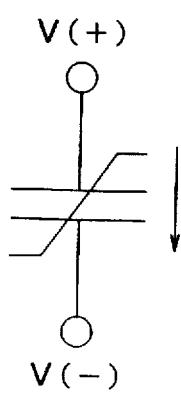
FIG. 1B is a view of the polarization state of a ferroelectric capacitor written with the data "1"
Figure 1C:
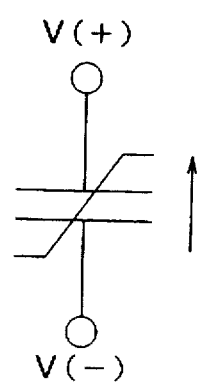
FIG. 1C is a view of the polarization state of a ferroelectric capacitor written with the data "0"

FIG. 1A is a view of the hysteresis of the residual charge in dielectric polarization, while FIG. 1B and FIG. 1C are views of the polarization states of a ferroelectric capacitor written with first data (data "1" as mentioned below) and second data (data "0" as mentioned below) complementary with each other.

The ferroelectric non-volatile memory, referring to the hysteresis of the polarization shown in FIG. 1A, adopts as the data "1" (first data) the state of the residual charge of dielectric polarization represented by +Qr (A in FIG. 1A) obtained by supplying a voltage to the ferroelectric capacitor in the plus direction (C in FIG. 1A) and adopts as the data "0" (second data) the state of the residual charge of dielectric polarization represented by –Qr (B in FIG. 1A) obtained by supplying a voltage to the ferroelectric capacitor in the negative direction (D in FIG. 1A). The ferroelectric memory is therefore utilized as a non-volatile memory.

Figure 2:
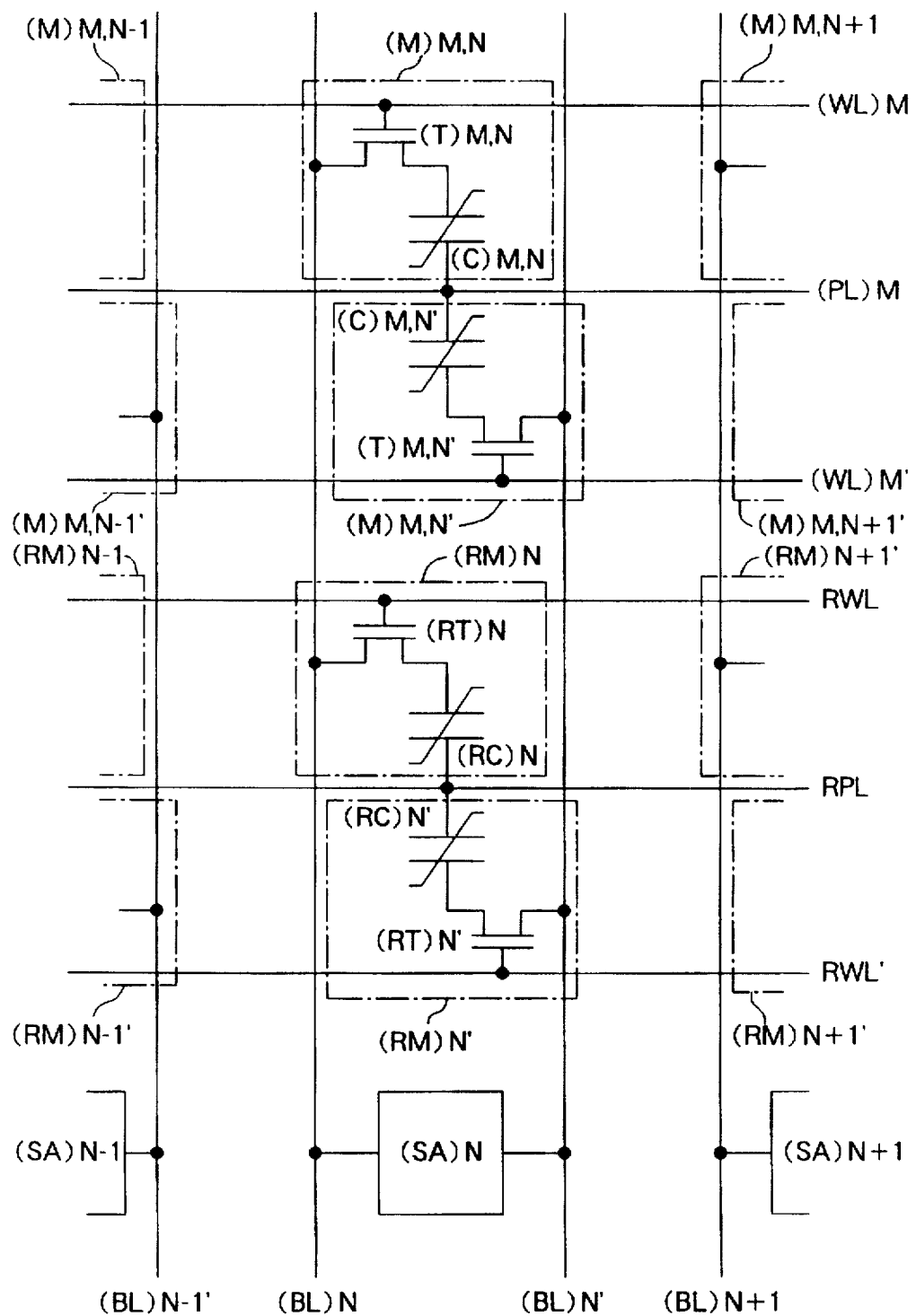
FIG. 2 is a view of a memory array of a folded bit-line structure in a ferroelectric non-volatile memory having one-transistor, one-capacitor (1TR-1CAP) type memory cells.

FIG. 2 is a view of a memory array of a ferroelectric memory having 1TR-1CAP type cells.

The memory array of FIG. 2 has a so-called folded bit-line structure. In the figure, (M)M,N–1, (M)M,N, and (M)M,N+1 represent memory cells arranged at intersections of an M-th word line and (N–1)-th, N-th, and (N+1)-th bit lines, while (M)N,N–1', (M)M,N', and (M)M,N+1' represent memory cells arranged at intersections between a bit line arranged in a folded direction and word lines corresponding to the bit line. (RM)N–1, (RM)N, and (RM)N+1 represent reference cells connected to the (N–1)-th, N-th, and (N+1)-th bit lines respectively, while (RM)N–1', (RM)N', and (RM)N+1' represent reference cells connected to a bit line arranged in the folded direction.

The memory cell (M)M,N is constituted by a select transistor (T)M,N and a ferroelectric capacitor (C)M,N.

The memory cell (M)M,N' is constituted by a select transistor (T)M,N' and a ferroelectric capacitor (C)M,N'.

Also, the memory cells (M)M,N−1, (M)M,N+1, (M)M, N−1', and (M)M,N+1' are each constituted by one select transistor and one ferroelectric capacitor, but the figure does not show these elements for convenience in illustration.

(BL)N−1', (BL)N, (BL)N', and (BL)N+1 represent (N−1) -th, N-th, and (N+1)-th bit lines or adjoining bit lines in the folded direction.

(WL)M represents an M-th word line, (WL)M' represents a word line provided corresponding to a bit line arranged in the folded direction, and (PL)M represents a common plate electrode.

RWL represents a reference word line for selecting the reference cell, RWL' represents a reference word line provided corresponding to a bit line arranged in the folded direction, and RPL represents a common plate electrode.

(SA)N−1, (SA)N, and (SA)N+1 represent sense amplifiers provided for each pair of bit lines of the (N−1)-th, N-th, and (N+1)-th bit lines and adjoining corresponding folded bit lines.

In a ferroelectric non-volatile memory having the 1TR-1CAP type cells of FIG. 2, the operation for reading out the data of the memory cell (M)M,N is performed by comparison with the data of the reference cell (RM)N' connected to the reference bit line (BL)N' arranged adjoining in a folded direction of the read bit line (BL)N. The operation for reading out the data of the memory cell (M)M,N' is performed by comparison with the data of the reference cell (RM)N connected to the reference bit line (BL)N arranged adjoining in a folded direction of the read bit line (BL)N'.

The reference cells (RM)N and (RM)N' are optimized in design by adjusting for example the area of the capacitor or bias voltage to give a middle state when the residual charge of the dielectric polarization represented by +Qr or −Qr in the hysteresis characteristic of FIG. 1A is read out.

Accordingly, in the 1TR-1CAP type cell, the potential difference between the read bit line connected to the read cell and the reference bit line connected to the reference cell is amplified by a sense amplifier SA to judge the data.

In FIG. 2, when reading out data of the memory cell (M)M,N, the data of the memory cells (M)M,N−1 and (M)M,N+1 adjoining the memory cell (M)M,N are read out at the same time.

Accordingly, the read out bit line (BL)N receives the coupling noise of both of the bit line (BL)N−1' adjoining the memory cell and the reference bit line (BL)N' adjoining in the folded direction.

Also, the reference bit line (BL)N' receives the coupling noise of both of the bit line (BL)N+1 adjoining memory cell and the read out bit line (BL)N adjoining the bit line (BL)N+1.

If the coupling noise between the bit lines is defined as a, the bit lines receive the maximum coupling noise VP between bit lines indicated by the following equation (1):

$$VP = a^*V_{cc} + a^*VMD \quad (1)$$

Here, $V_{cc}$ represents a power supply voltage, and VMD represents a potential difference between a read out bit line and a reference bit line which can be used in the ideal case free from noise.

In equation (1), the first term represents the coupling noise from the bit line adjoining the memory cell, and the second term represents the coupling noise from the other read out bit line or reference bit line of the pair.

Usually, a≈0.1, $V_{cc}$≈3.3V, and VMD≈0.6, so VP ≈0.39V by the above equation (1). This decreases the potential difference VMD≈0.6V of the read out bit line which can be used in the ideal case to below half, so the operational margin at the time of a read operation decreases greatly.

Figure 3:
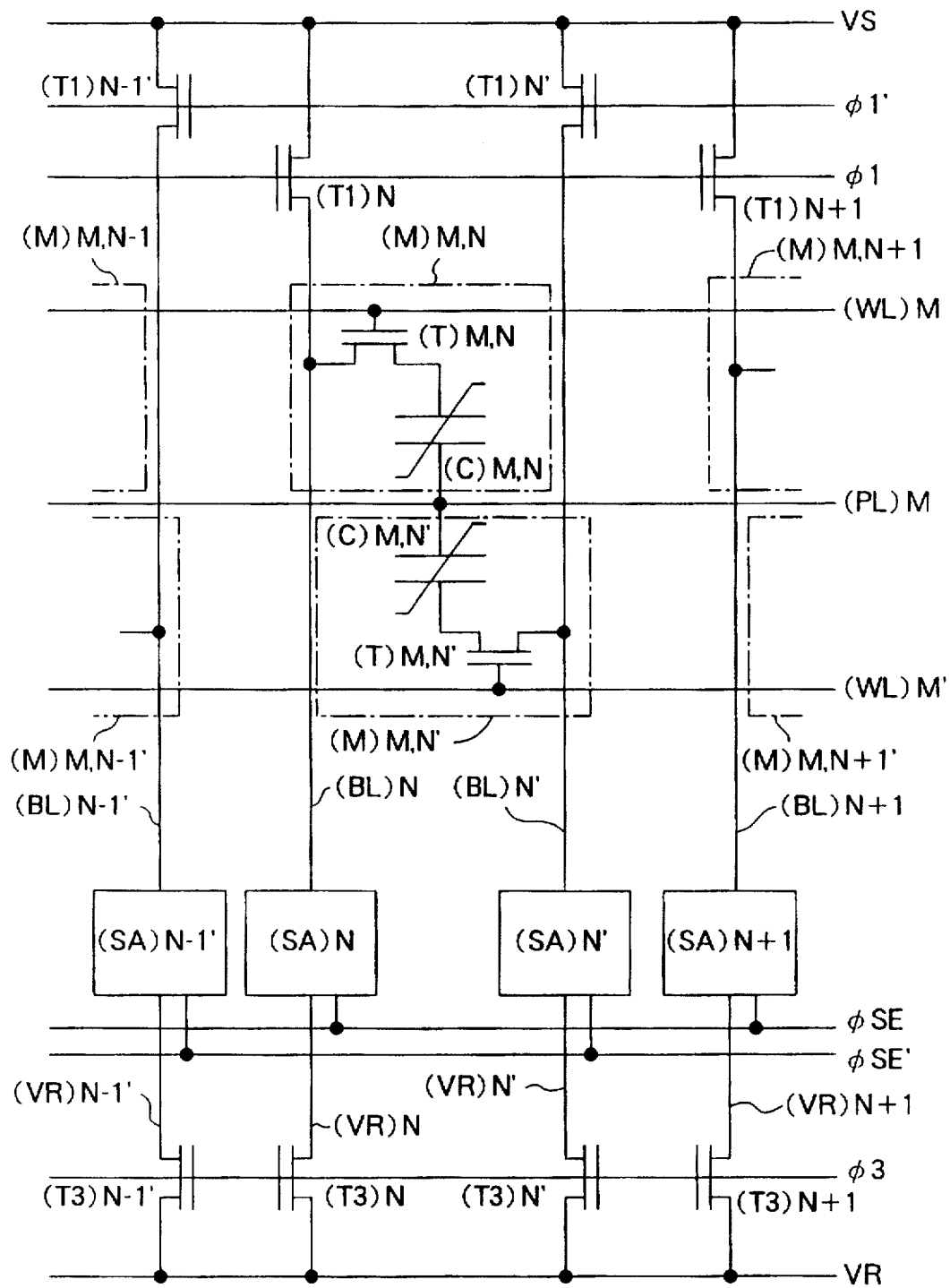
FIG. 3 is a view of a memory array showing a first embodiment of a ferroelectric non-volatile memory according to the present invention.

FIG. 3 is a view of a memory array showing a first embodiment of a ferroelectric non-volatile memory according to the present invention.

The memory array of FIG. 3 has a so-called folded bit-line structure.

In the figure, (M)M,N−1, (M)M,N, and (M)M,N+1 represent first memory cells arranged at intersections between an M-th word line and (N−1)-th, N-th, and (N+1)-th bit lines, while (M)M,N−1', (M)M,N', and (M)M,N+1' represent second memory cells arranged at intersections between a bit line arranged in the folded direction and word lines corresponding to the bit line.

The memory cell (M)M,N is constituted by a select transistor (T)M,N and a ferroelectric capacitor (C)M,N.

The memory cell (M)M,N' is constituted by a select transistor (T)M,N' and a ferroelectric capacitor (C)M,N'.

Also, the first memory cells (M)M,N−1 and (M)M,N+1 and the second memory cells (M)M,N−1' and (M)M,N+1' are each constituted by one select transistor and one ferroelectric capacitor, but the figure does not show these elements for convenience in illustration.

(BL)N and (BL)N+1 represent N-th and (N+1)-th first bit lines, while (BL)N−1' and (BL)N' represent (N−1)-th and N-th second bit lines adjoining in the folded direction.

(WL)M represent an M-th first word line, (WL)M' represents a second word line provided corresponding to a bit line arranged in the folded direction, and (PL)M represents a common plate electrode.

(SA)N and (SA)N+1 represent first sense amplifiers provided respectively corresponding to the N-th and (N+1)-th first bit lines and activated by a sense enable signal φSE.

(SA)N−1' and (SAb)N' represent second sense amplifiers provided respectively corresponding to the (N−1)-th and N-th first bit lines and activated by a sense enable signal φSE'.

(T1)N and (T1)N+1 represent transmission gates provided respectively corresponding to the N-th and (N+1)-th first bit lines (BL)N and (BL)N+1 and set the bit lines (BL)N and (BL)N+1 to a precharge voltage or a shield voltage VS by a control signal φ1.

(T1)N−1' and (T1)N' represent transmission gates provided respectively corresponding to the (N−1)-th and N-th second bit lines (BL)N−1' and (BL)N' and set the bit lines (BL)N−1' and (BL)N' to the precharge voltage or the shield voltage VS by a control signal φ1'.

(T3)N−1', (T3)N, (T3)N', and (T3)N+1 represent transmission gates provided respectively corresponding to the (N−1)-th, N-th and (N+1)-th first sense amplifiers (SA)N and (SA)N+1 or the second sense amplifiers (SA)N−1' and (SAb)N' and set nodes (VR)N−1', (VR)N, (VR)N', and (VR)N+1 of the sense amplifiers to a reference voltage VR for comparison.

FIG. 4 is a view of how the first bit line BL and the second bit line BL' are set and which of the first sense amplifier SA and the second amplifiers SA' is selected at the time of read out of the first memory cell M or the second cell M'.

Note that, in FIG. 4, the numbers of the bit lines and the word lines are omitted for convenience in illustration.

As shown in FIG. 4, when reading out the first memory cell MA, the data of the first memory cell MA is read out to the first bit line BL, the second bit line BL' is set to the shield voltage, the first sense amplifier SA is activated, and the second sense amplifier SA' is deactivated.

As a result, the data of the memory cell MA is read out to the bit line BL while being shielded by the shield bit line BL' adjoining the bit line BL. The data read out to the bit line BL is compared with the reference voltage VR in the sense amplifier SA to judge the data.

Also, when reading out the second memory cell MA', the data of the second memory cell MA' is read out to the second bit line BL', the first bit line BL is set to the shield voltage, the first sense amplifier SA is deactivated, and the second sense amplifier SA' is activated.

As a result, the data of the memory cell MA' is read out to the bit line BL' while being shielded by the shield bit line BL adjoining the bit line BL'. The data read out to the bit line BL' is compared with the reference voltage VR in the sense amplifier SA' to judge the data.

Next, an explanation will be made of a specific example of the operation for writing in a memory cell in the memory array of FIG. 3 with reference to a timing chart of FIG. 5.

Figure 5:
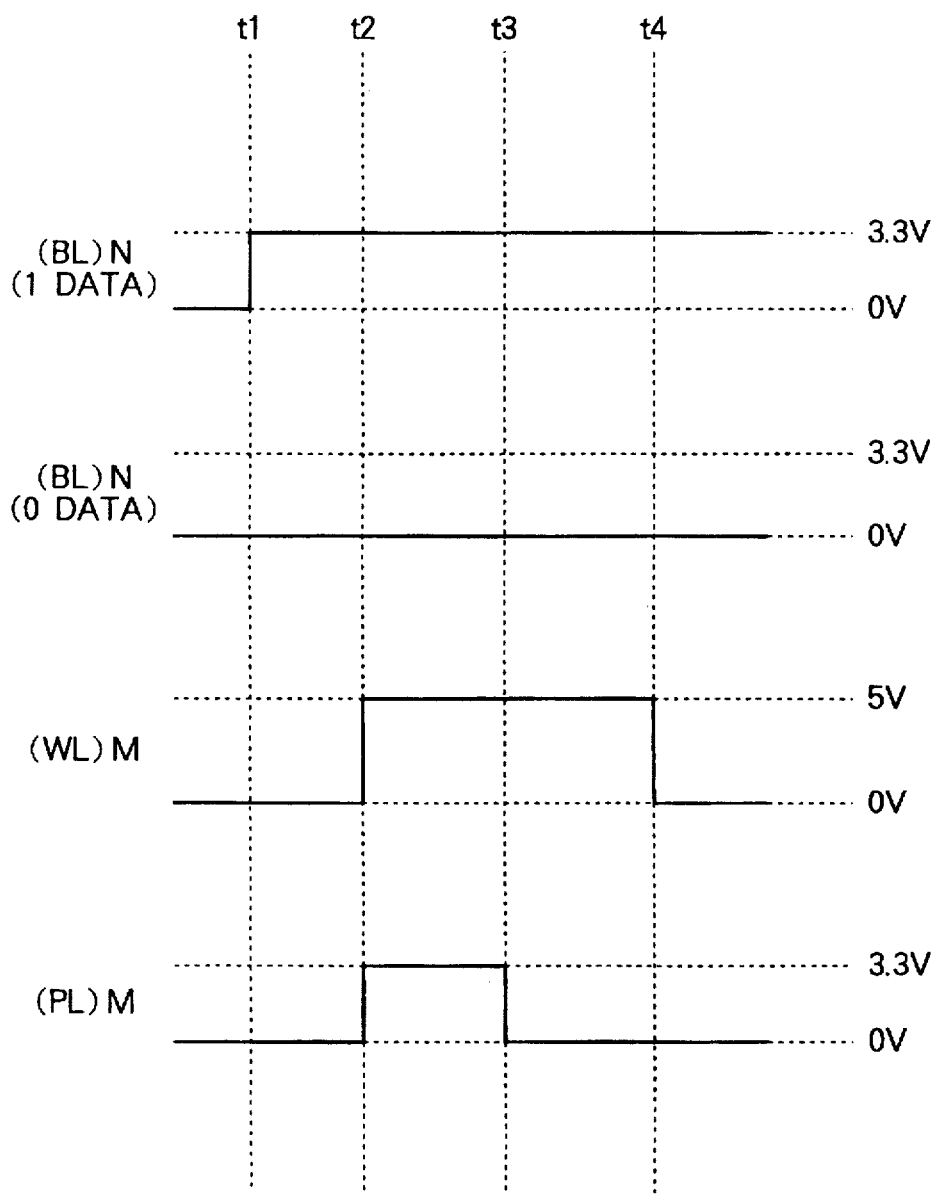
FIG. 5 is a timing chart showing the timing in a write operation in the memory array shown in FIG. 3.

The timing chart of FIG. 5 shows the timing when when selecting the M-th first bit line (BL)N and writing the data "1" or data "0" in the first memory cell (M)N,N.

The write operation is carried out for all of the first memory cells connected to the selected first word line at one time.

In this case, the data "1" is written by applying to the ferroelectric capacitor (C)M,N a voltage in a direction so that the potential of the selected bit line becomes higher than a potential of the selected plate electrode to cause that ferroelectric capacitor to polarize in the direction of the applied electric field.

The data "0" is written by applying to the ferroelectric capacitor (C)M,N a voltage in a direction so that the potential of the selected bit line becomes lower than a potential of the selected plate electrode to cause that ferroelectric capacitor to polarize in the direction of the applied electric field.

In the write operation, first, at the time t1, the bit line BLA connected to the first memory cell (M)M,N is set to the power supply voltage $V_{cc}$ (3.3V) when writing the data "1" or the ground voltage $V_{ss}$ (0V) when writing the data "0".

Next, at the time t2, the selected word line (WL)M is raised from 0V to 5V and the selected plate electrode line (PL)M is raised from 0V to 3.3V.

As a result, when the data to be written into the memory cell (M)M,N is the data "0", the ferroelectric capacitor (C)M,N of the memory cell (M)M,N shifts in state to a point D on the hysteresis characteristic of FIG. 1A until the time t3. This ends the writing of data "0" into the memory cell (M)M,N.

Next, at the time t3, the selected plate electrode line (PL)M is lowered from 3.3V to 0V.

As a result, when the data to be written into the memory cell (M)M,N is the data "1", the ferroelectric capacitor (C)M,N of the memory cell (M)M,N shifts in state to a point C on the hysteresis characteristic of FIG. 1A until the time t4. This ends the writing of data "1" into the memory cell (M)M,N.

Finally, the selected word line (WL)M falls from 5V to the ground voltage (0V). This ends the write operation.

Next, an explanation will be made of a concrete example of the operation for reading a memory cell in the memory array of FIG. 3 with reference to the timing chart of FIG. 6.

Figure 6:
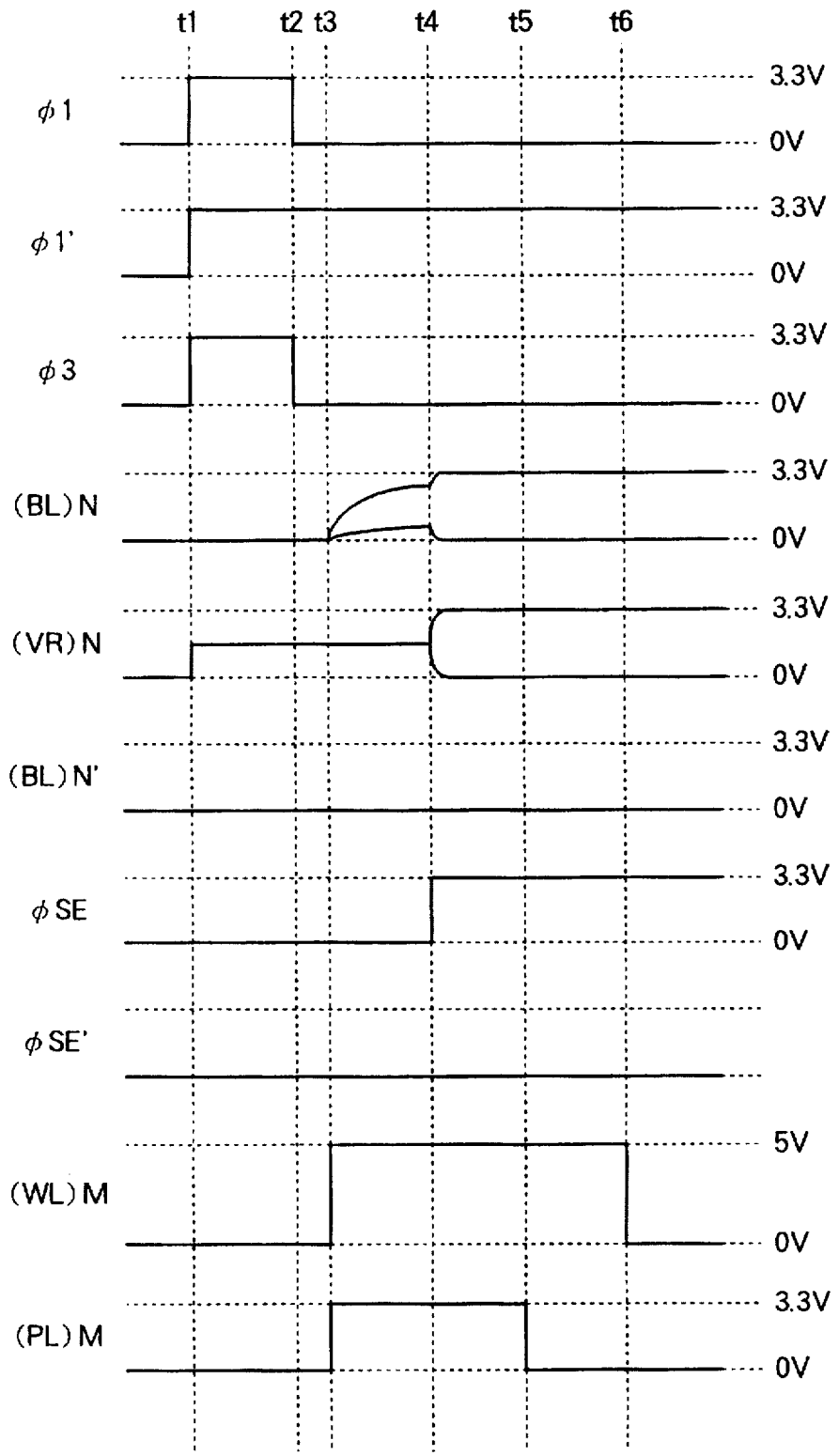
FIG. 6 is a timing chart showing the timing in a read operation in the memory array shown in FIG. 3.

The timing chart of FIG. 6 show the timing when selecting the M-th first word line (WL)M and the N-th first bit line (BL)N to read the data "1" or data "0" stored in the first memory cell (M)M,N then rewrite the same.

The read and write operations are carried out for all of the first memory cells connected to the selected first word line at one time.

In this case, data is read from a memory cell by starting up the selected word line, connecting the bit line to the selected memory cell, changing the voltage of the selected plate electrode line to change the polarization state of the ferroelectric capacitor of the memory cell, comparing the change of the potential of the bit line caused by the change of the polarization state of the ferroelectric capacitor with a reference voltage VR in the sense amplifier, then judging the data.

The data is rewritten in a memory cell in the same way as the operation for writing data of FIG. 5.

In the read operation, first, at the time t1, the control signals ($\phi 1$, $\phi 1'$, and ($\phi 3$ are raised from 0V to 3.3V. Due to this, the first bit line (BL)N and second bit line (BL)N' are set to the set voltage VS (0V) and one node (VR)N of the first sense amplifier (SA)N is set to the reference voltage VR for comparison until the time t2.

Next, at the time t2, the first bit line (BL)N and the node (VR)N are held in floating states by reducing the control signals $\phi 1$ and ($\phi 3$ to 0V.

In this case, the important thing is that the control signal $\phi 1'$ remains held at the high level, so the non-selected second bit line (BL)N' remains shielded at the set voltage VS (0V) during the read operation.

As a result, the first bit line (BL)N from whose memory cell data is to be read out is shielded by the second bit line (BL)N' arranged adjoining it in the folded direction, so it is possible to completely prevent the influence of coupling noise between the bit lines.

Next, at the time t3, the selected first word line (WL)M is raised from 0V to 5V, and the selected plate electrode line (PL)M is raised from 0V to the power supply voltage $V_{cc}$ (3.3V).

As a result, the ferroelectric capacitors of all of the memory cells connected to the selecting first word line (WL)M change in polarization state to a point D on the hysteresis characteristic of FIG. 1A.

Therefore, when the data "1" is stored in the first memory cell (M)M,N before read out, namely, when the ferroelectric capacitor (C)M,N is in the polarization state of the point A, the polarization state reverses and the change of potential of the first bit line (BL)N is large.

Also, when the data "0" is stored in the first memory cell (M)M,N before read out, namely, when the ferroelectric capacitor (C)M,N is in the polarization state of the point B, the polarization state does not reverse and the change of potential of the first bit line (BL)N is small.

Next, at the time t4, the first sense amplifier (SA)N is activated by raising the sense enable signal $\phi SE$ to the power supply voltage (3.3V).

As a result, the difference between the potential of the first bit line (BL)N and the potential of the node (VR)N is sensed by the first sense amplifier (SA)N.

Here, the node (VR)N is set to the reference voltage VR for comparison, namely, a voltage of about a middle value between the potential of the bit line when reading out the data "1" and the potential of the bit line when reading out the data "0".

As a result, the data stored in the first memory cell M(M),N is latched by the first sense amplifier (SA)N until the time t5. At this time, when the data "1" was stored, the potential of the first bit line (BL)N is set to the power supply voltage $V_{cc}$ (3.3V), while when the data "0" was stored, the potential of the first bit line (BL)N is set to the ground voltage (0V).

Also, from the time t4, the operation for rewriting the first read memory cell (M)M,N is begun.

First, when the data "0" is stored in the first memory cell (M)M,N, the ferroelectric capacitor (C)M,N shifts in state to the point D on the hysteresis characteristic of FIG. 1A until the time t5 when the selected plate electrode line (PL)M is reduced to the ground voltage (0V). This ends the rewriting of the data "0".

Next, at the time t5, the selected plate electrode line (PL)M is reduced to the ground voltage (0V).

As a result, when the data "1" is stored in the first memory cell (M)M,N, the ferroelectric capacitor (C)M,N shifts in state to the point C on the hysteresis characteristic of FIG. 1A until the time t6. This ends the rewriting of the data "1".

Finally, the selected word line (WL)M is reduced to the ground voltage (0V). This ends all operations.

As explained above, according to the first embodiment of the ferroelectric non-volatile memory, there is provided a memory array of 1TR-1CAP type memory cells and a folded bit-line structure wherein the bit lines are each arranged adjoining folded bit lines arranged so that they alternate with them. Further, when reading out the data of a memory cell, the bit line in the folded direction of the read bit line is set to a constant shield voltage. Therefore, it is possible to completely prevent coupling noise between bit lines.

Also, since one of the pair of sense amplifiers provided corresponding to the folded bit-line structure is deactivated in accordance with the selection of a memory cell, it is possible to reduce the power consumption at the time of operation.

Figure 7:
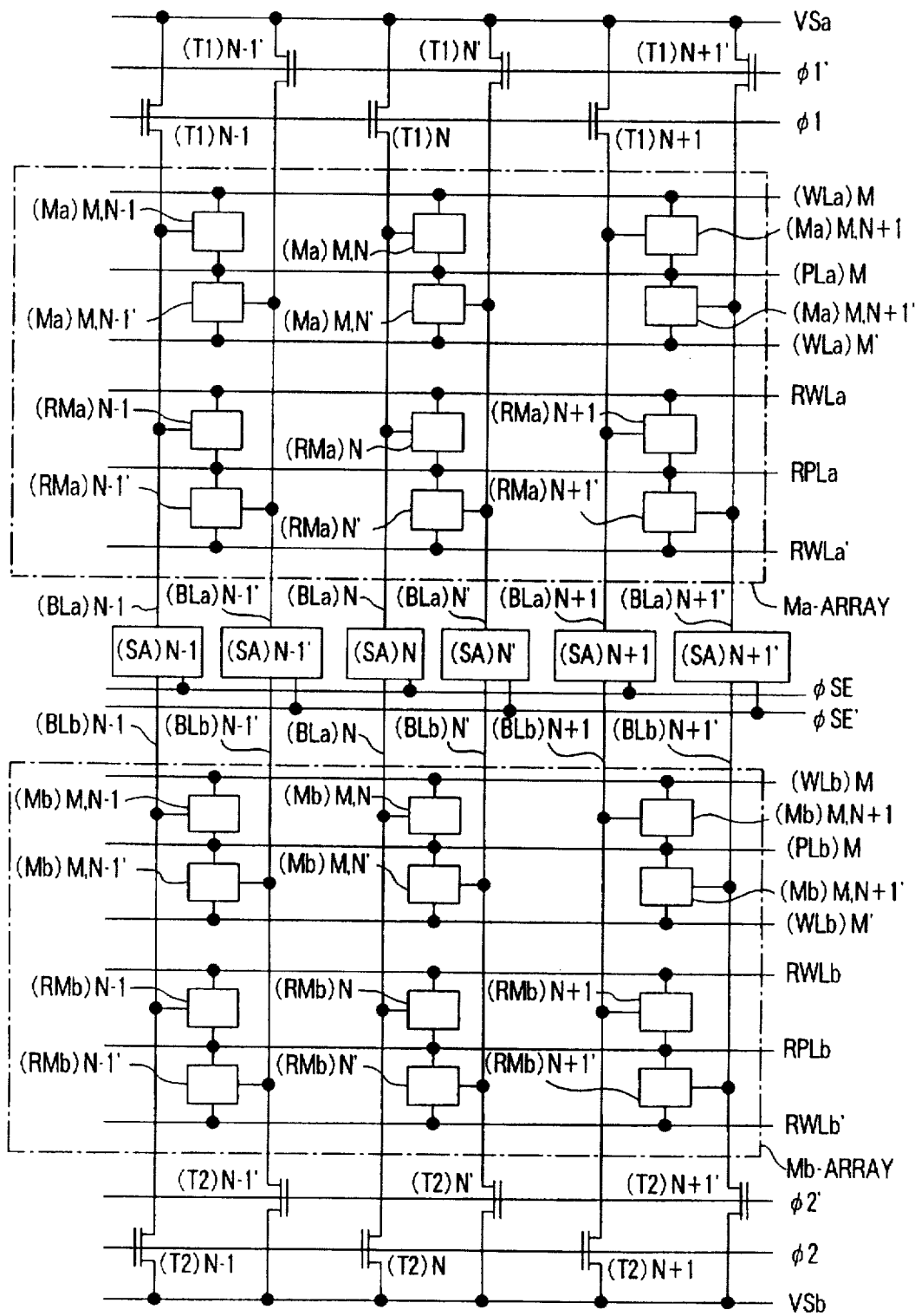
FIG. 7 is a view of a memory array showing a second embodiment of a ferroelectric non-volatile memory according to the present invention.

FIG. 7 is a view of a memory array of a second embodiment of a ferroelectric non-volatile memory according to the present invention.

The memory array according to the second embodiment shown in FIG. 7, as a whole, has a folded bit-line structure. The memory array is constituted by two smaller memory arrays of a first (A side) memory array Ma-ARRAY and a second (B side) memory array Mb-ARRAY arranged as a pair.

In the A side memory array Ma-ARRAY, (Ma)M,N−1, (Ma)M,N, and (Ma)M,N+1 represent 1TR-1CAP type 1a-th memory cells arranged at intersections between an M-th 1a-th word line and (N−1)-th, N-th, and (N+1)-th 1a-th bit lines.

(Ma)M,N−1', (Ma)M,N', and (Ma)M,N+1' represent 1TR-1CAP type 2a-th memory cells arranged at intersections between an M-th 2a-th word line and (N−1)-th, N-th, and (N+1)-th 2a-th bit lines.

(RMa),N−1, (RMa),N, and (RMa),N+1 represent 1TR-1CAP type 1a-th reference cells provided respectively corresponding to the (N−1)-th, N-th, and (N+1)-th 1a-th bit lines.

(RMa),N−1', (RMa),N', and (RMa), N+1' represent 1TR-1CAP type reference cells provided respectively corresponding to the (N−1)-th, N-th, and (N+1)-th 2a-th bit lines.

(WLa)M represents an M-th 1a-th word line, (WLa)M' represents an M-th 2a-th word line, and (PL)M represents a common plate electrode.

RWLa represents a 1a-th reference word line, RWLa' represents a 2a-th reference word line, and RPLa represents a common plate electrode.

(BLa)N−1, (BLa)N, and (BLa)N+1 represent respectively (N−1)-th, N-th, and (N+1)-th 1a-th bit lines. (BLa)N−1', (BLa)N', and (BLa)N+1' represent 2a-th bit lines arranged adjoining in the folded direction.

In the B side memory array Mb-ARRAY, (Mb)M,N−1, (Mb)M,N, and (Mb)M,N+1 represent 1TR-1CAP type 1b-th memory cells arranged at intersections between an M-th 2b-th word line and (N−1)-th, N-th, and (N+1)-th 2b-th bit lines.

(Mb)M,N−1', (Mb)M,N', and (Mb)M,N+1' represent 1TR-1CAP type 2b-th memory cells arranged at intersections between an M-th 2b-th word line and (N−1)-th, N-th, and (N+1)-th 2b-th bit lines.

(RMb),N−1, (RMb),N, and (RMb),N+1 represent 1TR-1CAP type 1b-th reference cells provided respectively corresponding to the (N−1)-th, N-th, and (N+1)-th 1b-th bit lines.

(RMb),N−1', (RMb),N', and (RMb),N+1' represent 1TR-1CAP type reference cells provided respectively corresponding to the (N−1)-th, N-th, and (N+1)-th 2b-th bit lines.

(WLb)M represents an M-th 1b-th word line, (WLb)M' represents an M-th 2b-th word line, and (PLb)M represents a common plate electrode.

RWLb represents a 1b-th reference word line, RWLb' represents a 2b-th reference word line, and RPLb represents a common plate electrode.

(BLb)N−1, (BLb)N, and (BLb)N+1 represent respectively (N−1)-th, N-th, and (N+1)-th 1b-th bit lines. (BLb)N−1', (BLb)N', and (BLb)N+1' represent 2b-th bit lines arranged adjoining in the folded direction.

(SA)N−1, (SA)N, and (SA)N+1 represent first sense amplifiers provided respectively corresponding to the (N−1)-th, N-th, and (N+1)-th 1a-th bit lines (BLa)N−1, (BLa)N, and (BLa)N+1 and 1b-th bit lines (BLb)N−1, (BLb)N, and (BLb)N+1 and activated by a sense enable signal $\phi$SE.

(SA)N−1', (SAb)N', and (SA)N+1' represent second sense amplifiers provided respectively corresponding to the (N−1)-th, N-th, and (N+1)-th 2a-th bit lines (BLa)N−1', (BLa)N', and (BLa)N+1' and 2b-$t_h$ bit lines (BLb)N−1', (BLb)N' and (BLb)N+1' and activated by a sense enable signal $\phi$SE'.

(T1)N−1, (T1)N, and (T1)N+1 represent transmission gates provided respectively corresponding to the (N−1)-th, N-th, and (N+1)-th 1a-th bit lines (BLa)N−1, (BLa)N and (BLa)N+1 and set the bit lines (BLa)N−1, (BLa)N, and (BLa)N+1 to a recharge voltage or a shield voltage VSa by a control signal $\phi$1.

(T1)N−1 ', (T1)N', and (T1)N+1' represent transmission gates provided respectively corresponding to the (N−1)-th, N-th, and (N+1)-th 2a-th bit lines (BLa)N−1', (BLa)N', and (BLa)N+1' and set the bit lines (BLa)N−1', (BLa)N', and (BLa)N+1' to the recharge voltage or the shield voltage VSa by a control signal $\phi$1'.

(T2)N−1, (T2)N, and (T2)N+1 represent transmission gates provided respectively corresponding to the (N−1)-th, N-th, and (N+1)-th 1b-th bit lines (BLb)N−1, (BLb)N, and (BLb)N+1 and set the bit lines (BLb)N−1, (BLb)N, and B(Lb)N+1 to the recharge voltage or a shield voltage VSb by a control signal $\phi$2.

(T2)N−1', (T2)N', and (T2)N+1' represent transmission gates provided respectively corresponding to the (N−1)-th, N-th, and (N+1)-th 2b-th bit lines (BLb)N−1', (BLb)N', and (BLb)N+1 ' and set the bit lines (BLb)N−1', (BLb)N', and (BLb)N+1 ' to the recharge voltage or the shield voltage VSb by a control signal $\phi$2'.

FIG. 8 is a view of how the 1a-th bit line BLa, the 2a-th bit line BLa', the 1b-th bit line BLb, and the 2b-th bit line BLb' are set and which of the first sense amplifier SA and the second amplifier SA' is selected at the time of read out of the 1a-th memory cell Ma, the 2a-th memory cell Ma', the 1b-th memory cell Mb, and the 2b-th memory cell Mb'.

Note that, in FIG. 8, the numbers of the bit lines and the word lines are omitted for convenience in illustration.

As shown in FIG. 8, when reading out the 1a-th memory cell Ma, the data of the 1a-th memory cell Ma is read out to the 1a-th bit line BLa, the data of the 1b-th reference memory cell RMb is read out to the 1b-th bit lines BLb, the 2a-th bit line BLa' and the 2b-th bit line BLb' are set to the shield voltage, the first sense amplifier SA is activated, and the second sense amplifier SA' is deactivated.

As a result, the data of the 1a-th memory cell Ma is read out to the bit line BLa and the data of the 1b-th reference cell RMb is read out to the reference bit line BLb while being shielded by the adjoining shield bit line, and the data read out to the bit line BLa and the reference bit line BLb are compared in the first sense amplifier SA to judge the data.

Also, when reading out the 2a-th memory cell Ma', the data of the 2a-th memory cell Ma' is read out to the 2a-th bit line BLa', the data of the 2b-th reference cell RMb' is read out to the 2b-th bit line BLb', the 1a-th bit line BLa and the 1b-th bit line BLb are set to the shield voltage, the first sense amplifier SA is deactivated, and the second sense amplifier SA' is activated.

As a result, the data of the 2a-th memory cell Ma' is read out to the bit line BLa' and the data of the 2b-th reference cell RMb' is read out to the reference bit line BLb' while being shielded by the adjoining shield bit line, and the data read out to the bit line BLa' and the reference bit line BLb' are compared in the second sense amplifier SA' to judge the data.

Also, when reading out the 1b-th memory cell Mb, the data of the 1b-th memory cell Mb is read out to the 1b-th bit line BLb, the data of the 1a-th reference cell RMa is read out to the 1a-th bit line BLa, the 2a-th bit line BLa' and the 2b-th bit line BLb' are set to the shield voltage, the first sense amplifier SA is activated, and the second sense amplifier SA' is deactivated.

As a result, the data of the 1b-th memory cell Mb is read out to the read out bit line BLb, the data of the 1a-th reference cell RMa is read out to the reference bit line BLa, and the data read out to the bit line BLb and the reference bit line BLa are compared in the first sense amplifier SA to judge the data.

Also, when reading out the 2b-th memory cell Mb', the data of the 2b-th memory cell Mb' is read out to the 2b-th bit line BLb', the data of the 2a-th reference cell RMa' is read out to the 2a-th bit line BLa', the 1a-th bit line BLa and the 1b-th bit line BLb are set to the shield voltage, the first sense amplifier SA is deactivated, and the second sense amplifier SA' is activated.

As a result, the data of the 2b-th memory cell Mb' is read out to the bit line BLb' and the data of the 2a-th reference cell RMa' is read out to the reference bit line BLa' while being shielded by the adjoining shield bit line, and the data read out to the bit line BLa' and the reference bit line BLb' are compared in the second sense amplifier SA' to judge the data.

In the memory array of FIG. 7, the operation for writing in a memory cell is the same as the operation for writing data of FIG. 5, so further explanation will be omitted.

Next, an explanation will be made of a concrete example of the operation for reading a memory cell in the memory array of FIG. 7 with reference to the timing chart of FIG. 9.

Figure 9:
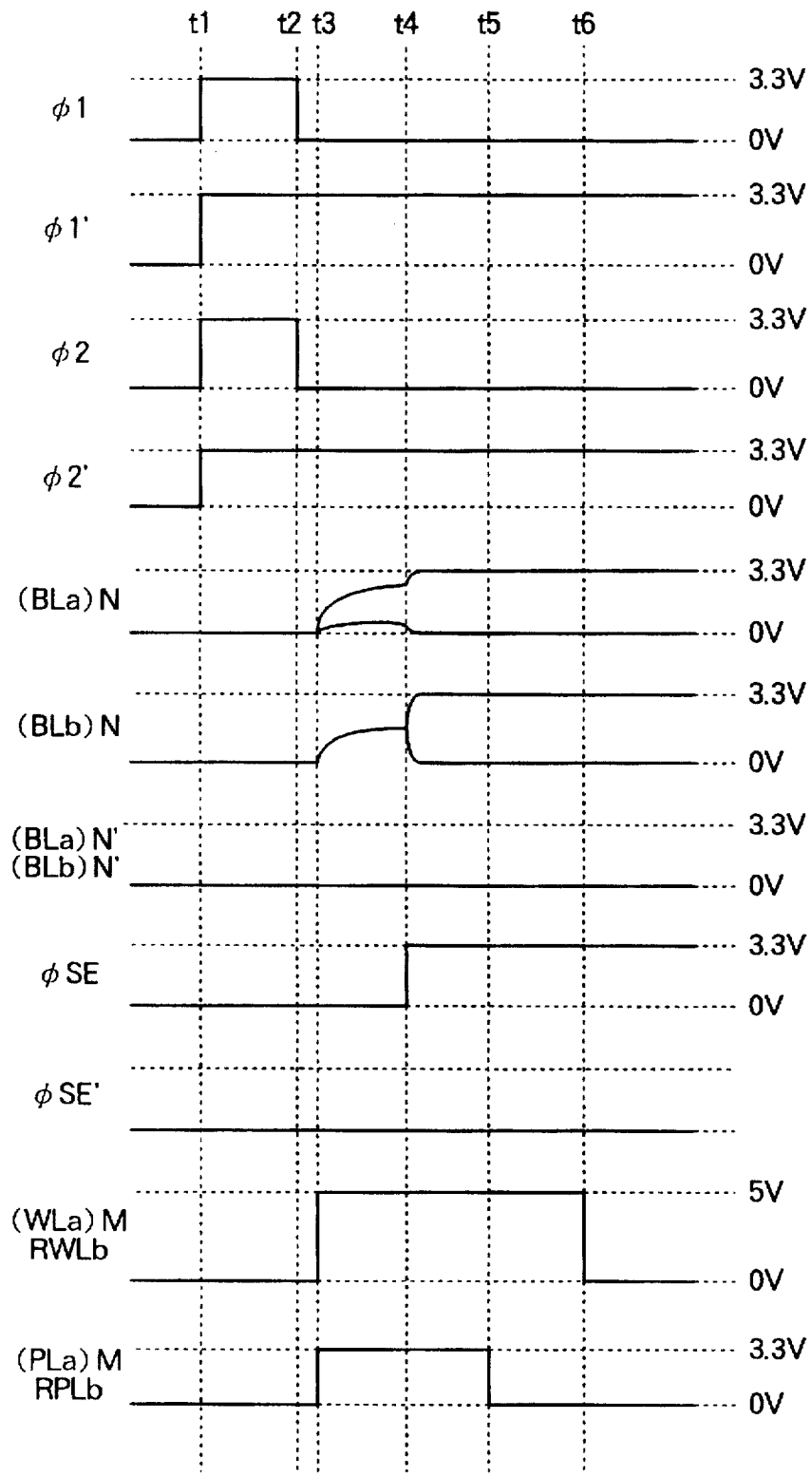
FIG. 9 is a timing chart showing the timing in a read operation in the memory array shown in FIG. 7.

The timing chart of FIG. 9 shows the timing when selecting the M-th 1a-th word line (WLa)M and N-th 1a-th bit line (BLa)N to read the data "1" or data "0" stored in the 1a-th memory cell (Ma)M,N and then rewrite the same.

The operation for reading and rewriting is performed for all 1a-th memory cells connected to the selected 1a-th word line at one time.

In this case, the data is read from a memory cell by comparing in the sense amplifier the difference in potential between a pair of a read out bit line from whose memory cell data is read out and a bit line from whose reference cell data is read out to judge the data.

The operation for rewriting a memory cell is the same as the operation for writing data of FIG. 5.

In the read operation, first, at the time t1, the control signals $\phi1$, $\phi1$' and $\phi2$, $\phi2$' are raised from 0V to the power supply voltage (3.3V). Due to this, the 1a-th bit line (BLa)N, the 2a-th bit line (BLa)N', the 1b-th bit line (BLb)N, and the 2b-th bit line (BLb)N' are set to the set voltage VSa or VSb (0V) until the time t2.

Next, at the time t2, the 1a-th bit line (BLa)N and the 1b-th bit line (BLb)N are held in floating states by reducing the control signals $\phi1$ and $\phi2$ to 0V.

In this case, the important thing is that the control signals $\phi1$' and $\phi2$' remain held at the high level, so the non-selected 2a-th bit line (BLa)N' and 2b-th bit line (BLb)N' remain shielded at the set voltage VA or VSb(0V) during the read operation.

As a result, the 1a-th bit line (BLa)N from whose memory cell data is read out and the 1b-th bit line (BLb)N from whose reference cell data is read out are shielded by the 2a-th bit line (BLa)N' and the 2b-th bit line (BLb)N' arranged alternately adjoining in the folded direction, so it is possible to completely prevent the influence of coupling noise between the bit lines.

Next, at the time t3, the selected 1a-th word line (WLa)M and the 1b-th reference word line RWLb are raised from 0V to 5V, and the selected plate electrode line (PLa)M and the reference plate electrode line RPLb are raised from 0V to the power supply voltage $V_{cc}$ (3.3V).

As a result, the ferroelectric capacitors of all of the memory cells connected to the selected 1a-th word line (WLa)M and all of the reference memory cells connected to the selected 1b-th reference word line RWLb shift in polarization state to a point D on the hysteresis characteristic of FIG. 1A.

Therefore, when the data "1" is stored in the 1a-th memory cell (Ma)M,N before read out, namely, when the ferroelectric capacitor (C)M,N is in the polarization state of the point A, the polarization state reverses and the change of potential of the 1a-th bit line (BLa)N is large.

Also, when the data "0" is stored in the 1a-th memory cell (Ma)M,N before read out, namely, when the ferroelectric capacitor (C)M,N is in the polarization state of the point B, the polarization state does not reverse and the change of potential of the 1a-th bit line (BLa)N is small.

The 1b-th reference cell (RMb)N is optimally designed so that the 1b-th bit line (BLb)N becomes a value intermediate between the potentials of the bit line at the time of reading these two types of data by adjusting the area of the capacitor, setting the bias, and the like.

Next, at the time t4, the first sense amplifier (SA)N is activated by raising the sense enable signal (SE to the power supply voltage (3.3V).

As a result, the difference between the potential of the 1a-th bit line (BLa)N and the potential of the 1b-th bit line (BLb)N is sensed by the first sense amplifier (SA)N.

As a result, the data stored in the 1a-th memory cell (Ma)M,N is latched by the first sense amplifier (SA)N until the time t5. At this time, when the data "1" is stored, the potential of the 1a-th bit line (BLa)N is set to the power supply voltage $V_{cc}$ (3.3V) and the potential of the 1b-th bit line (BLb)N is set to the ground voltage (0V).

When the data "0" is stored, the potential of the 1a-th bit line (BLa)N is set to the ground voltage (0V) and the potential of 1b-th bit line (BLb)N is set to the power supply voltage $V_{cc}$ (3.3V).

Also, from the time t4, the operation for rewriting the 1a-th read memory cell (Ma)M,N and the 1b-th reference cell (RMb)N is begun.

First, when the data "0" is stored in the 1a-th memory cell (M)M,N or the 1b-th reference cell (RMb)N, the ferroelectric capacitor shifts in state to the point D on the hysteresis characteristic of FIG. 1A until the time t5 when the selected plate electrode line (PLa)M and RPLb are reduced to the ground voltage (0V). This ends the rewriting of the data "0".

Next, at the time t5, the selected plate electrode lines (PLa)M and RPLb are reduced to the ground voltage (0V).

As a result, when the data "1" is stored in the 1a-th memory cell (Ma)M,N or the 1b-th reference cell (RMb)N, the ferroelectric capacitor shifts in state to the point C on the hysteresis characteristic of FIG. 1A until the time t6. Finally, the selected 1a-th word line (WLa)M and the 1b-th reference word line RWLb are reduced to the ground voltage (0V). This ends all operations.

Figure 10:
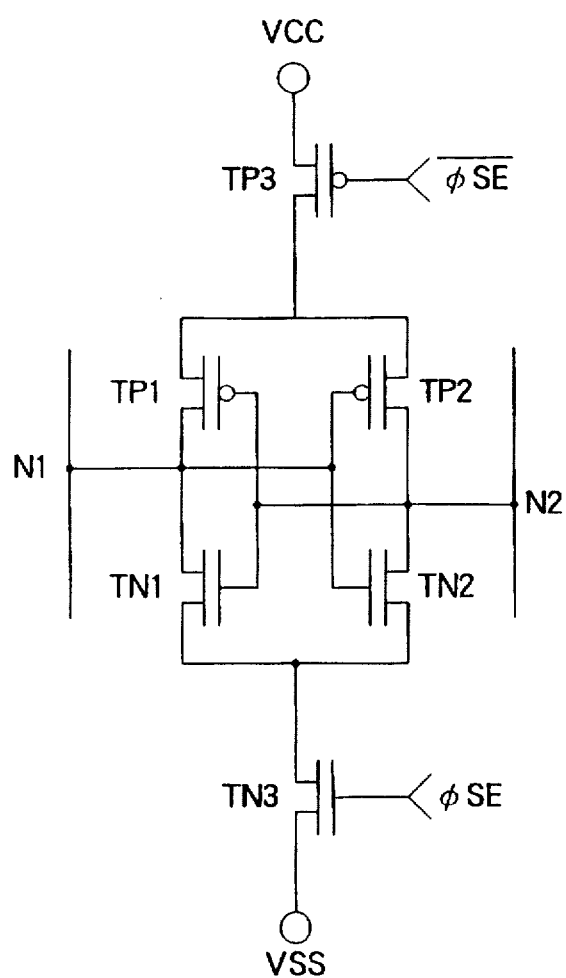
FIG. 10 is a circuit diagram of an example of a sense amplifier.

FIG. 10 Is a circuit diagram of an example of a sense amplifier SAN in the memory arrays of FIG. 7 and FIG. 3.

In the sense amplifier of FIG. 10, a latch circuit is constituted by a complementary inverter comprising a p-channel metal oxide semiconductor (PMOS) transistor TRI and an n-channel MOS (NMOS) transistor TN1 and a PMOS transistor TR2 and an NMOS transistor TN2.

The latch circuit amplifies and latches the potential difference between the nodes N1 and N2 by the activation of the PMOS transistor TP3 and NMOS transistor TN3 upon receipt of the sense enable signal $\phi$SE.

As explained above, according to the second embodiment of the ferroelectric non-volatile memory, there is provided a memory array A and memory array B of 1TR-1CAP type memory cells and folded bit-line structures wherein the bit lines are each arranged adjoining folded bit lines arranged so that they alternate with them. Further, when reading out the data of a memory cell, the bit line in the folded direction of the read bit line of the selected memory array and the bit line in the folded direction of the reference bit line of the non-selected memory array are set to a constant shield voltage. Therefore, it is possible to completely prevent coupling noise between the bit lines.

Also, since one of the pair of sense amplifiers provided corresponding to the folded bit line structure of the selected memory array is deactivated in accordance with the selection of a memory cell, it is possible to reduce the power consumption at the time of operation.

Many widely different embodiments of the present invention may be constructed without departing from the spirit and scope of the present invention. It should be understood that the present invention is not restricted to the specific embodiments described above.

What is claimed is:

1. A ferroelectric non-volatile memory comprising:
at least one first bit line and at least one second bit line arranged adjoining each other in a column direction and together constituting a folded bit-line structure,
a first word line and a second word line arranged in a row direction orthogonal to the folded direction,
a first memory cell constituted by a first ferroelectric capacitor and a first select transistor, one terminal of the first select transistor being connected to the first bit line, another terminal of the first select transistor being connected to one electrode of the first ferroelectric capacitor, and a gate of the first select transistor being connected to the first word line,
a second memory cell constituted by a second ferroelectric capacitor and a second select transistor, one terminal of the second select transistor being connected to the second bit line, another terminal of the second select transistor being connected to one electrode of the second ferroelectric capacitor, and a gate of the second select transistor being connected to the second word line,
a first sense amplifier provided corresponding to the first bit line, and
a second sense amplifier provided corresponding to the second bit line,
wherein, when selecting the first memory cell and reading out its data, the data of the first memory cell is read out to the first bit line with the second bit line being set to a constant shield voltage, a potential of the first bit line and a reference voltage for comparison are compared by the first sense amplifier, and the data of the first memory cell is electronically determined as a result of the comparison and,
when selecting the second memory cell and reading out its data, the data of the second memory cell is read out to the second bit line with the first bit line being set to a constant shield voltage, a potential of the second bit line and a reference voltage for comparison are compared by the second sense amplifier, and the data of the second memory cell is electronically determined as a result of the comparison.

2. A ferroelectric non-volatile memory according to claim 1, wherein
when selecting the first memory cell and reading out its data, the second sense amplifier is deactivated, and
when selecting the second memory cell and reading out its data, the first sense amplifier is deactivated.

3. A ferroelectric non-volatile memory, comprising:
a first memory array constituted by at least one 1a-th bit line and at least one 2a-th bit line arranged adjoining each other in a column direction and together constituting a folded bit-line structure, a 1a-th word line and a 2a-th word line arranged in a row direction orthogonal to the folded direction, a 1a-th memory cell constituted by a ferroelectric capacitor and a select transistor, one terminal of the select transistor being connected to the 1a-th bit line, another terminal of the select transistor being connected to an electrode of the ferroelectric capacitor, and a gate of the select transistor being connected to the 1a-th word line, a 2a-th memory cell constituted by a ferroelectric capacitor and a select transistor, one terminal of the select transistor being connected to the 2a-th bit line, another terminal of the select transistor being connected to one electrode of the ferroelectric capacitor, and a gate of the select transistor being connected to the 2a-th word line, a 1a-th reference cell provided corresponding to the 1a-th bit line, and a 2a-th reference cell provided corresponding to the 2a-th bit line;
a second memory array constituted by at least one 1b-th bit line and at least one 2b-th bit line arranged adjoining each other in a column direction and together constituting a folded bit-line structure, a 1b-th word line and a 2b-th word line arranged in a row direction orthogonal to the folded direction, a 1b-th memory cell constituted by a ferroelectric capacitor and a select transistor, one terminal of the select transistor being connected to the 1b-th bit line, another terminal of the select transistor being connected to one electrode of the ferroelectric capacitor, and a gate of the select transistor being connected to the 1b-th word line, a 2b-th memory cell constituted by a ferroelectric capacitor and a select transistor, one terminal of the select transistor being connected to the 2b-th bit line, another terminal of the select transistor connected to an electrode of the ferroelectric capacitor, and a gate of the select transistor being connected to the 2b-th word line, a 1b-th reference cell provided corresponding to the 1b-th bit line, and a 2b-th reference cell provided corresponding to the 2b-th bit line;

a first sense amplifier comparing a potential of the 1a-th bit line with a potential of the 1b-th bit line and reading out the data; and a second sense amplifier comparing a potential of the 2a-th bit line with a potential of the 2b-th bit line and reading out the data.

4. A ferroelectric non-volatile memory according to claim 3, wherein when selecting the 1a-th memory cell and reading out its data, the data of the 1a-th memory cell is read out to the 1a-th bit line with the 2a-th and 2b-th bit lines being set to a constant shield voltage, a potential of the 1a-th bit line and a potential of the 1b-th bit line are compared by the first sense amplifier, and the data of the 1a-th memory cell is electronically determined as a result of the comparison, when selecting the 2a-th memory cell and reading out its data, the data of the 2a-th memory cell is read out to the 2a-th bit line and the data of the 2b-th reference cell is read out to the 2b-th bit line with the 1a-th and 1b-th bit lines being set to a constant shield voltage, a potential of the 2a-th bit line and a potential of the 2b-th bit line are compared by the first sense amplifier, and the data of the 2a-th memory cell is electronically determined as a result of the comparison, when selecting the 1b-th memory cell and reading out its data, the data of the 1b-th memory cell is read out to the 1b-th bit line and the data of the 1a-th reference cell is read out to the 1a-th bit line with the 2a-th and 2b-th bit lines being set to a constant shield voltage, a potential of the 1a-th bit line and a potential of the 1b-th bit line are compared by the first sense amplifier, and the data of the 1b-th memory cell is electronically determined as a result of the comparison, and when selecting the 2b-th memory cell and reading out its data, the data of the 2b-th memory cell is read out to the 2b-th bit line and the data of the 2a-th reference cell is read out to the 2a-th bit line with the 1a-th and 1b-th bit lines being set to a constant shield voltage, a potential of the 2a-th bit line and a potential of the 2b-th bit line are compared by the second sense amplifier, and the data of the 2b-th memory cell is electronically determined as a result of the comparison.

5. A ferroelectric non-volatile memory according to claim 3, wherein when selecting the 1a-th or 1b-th memory cells and reading out its data, the second sense amplifier is deactivated, and when selecting the 2a-th or 2b-th memory cell and reading out its data, the first sense amplifier is deactivated.

* * * * *